United States Patent [19]

Hanson

[11] 4,095,998

[45] Jun. 20, 1978

[54] THERMOELECTRIC VOLTAGE GENERATOR

[75] Inventor: Charles M. Hanson, Springfield, Va.

[73] Assignee: The United States of America as represented by the Secretary of the Army, Washington, D.C.

[21] Appl. No.: 728,379

[22] Filed: Sep. 30, 1976

[51] Int. Cl.² .................. H01L 35/04; H01L 35/30
[52] U.S. Cl. .................. 136/208; 136/205; 136/218
[58] Field of Search ............... 136/208, 205, 218

[56] References Cited

U.S. PATENT DOCUMENTS

| 808,086 | 12/1905 | Heil | 136/208 |
|---|---|---|---|
| 1,118,269 | 11/1914 | Creveling | 136/208 X |
| 3,794,527 | 2/1974 | Kim | 136/208 |
| 3,833,428 | 9/1974 | Snyder et al. | 136/208 X |

*Primary Examiner*—Maynard R. Wilbur
*Assistant Examiner*—Richard E. Berger
*Attorney, Agent, or Firm*—Nathan Edelberg; Max L. Harwell; Robert P. Gibson

[57] ABSTRACT

A thermoelectric voltage generator utilizing heat from a vehicle exhaust to provide a differential temperature through a plurality of thermoelectric elements comprised of serially connected alternate N- and P-type semiconductors having alternate electrical contacts between adjacent elements at a hot side and at a cold side to produce electrical energy in accordance with the Seebeck effect and in which the electrical energy is applied to an external device by way of connections at opposite ends of said plurality of thermoelectric elements.

7 Claims, 2 Drawing Figures

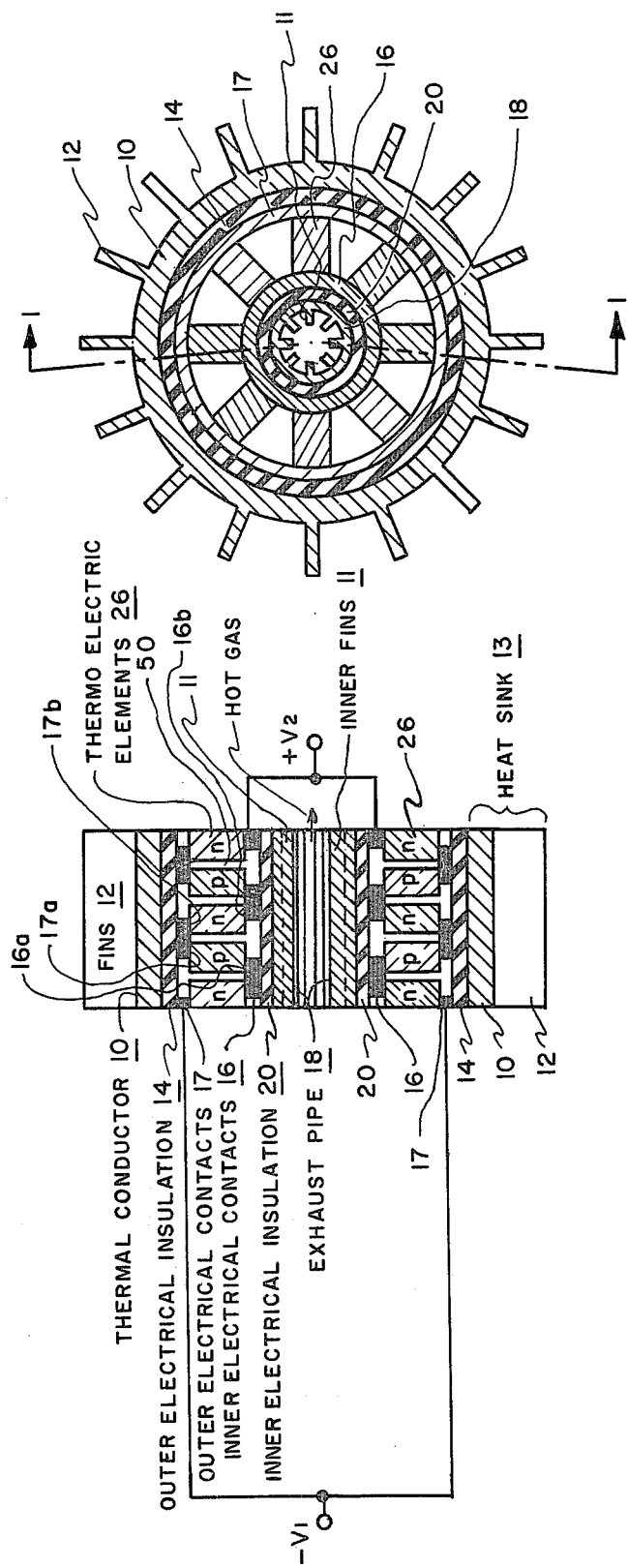

THERMOELECTRIC VOLTAGE GENERATOR

The invention described herein may be manufactured, used, and licensed by the U.S. Government for governmental purposes without the payment of any royalties thereon.

BACKGROUND OF THE INVENTION

The high temperatures reached by parts of an automobile engine suggests the application of engine waste heat to the generation of usable power. Electrical energy generated in this manner could be used to supplement the power of a generator or alternator, or could be used to drive specific eletrical components (e.g., lights, fan, radio, air conditioner, etc). The principle advantage of this method is that the primary source of energy is waste heat, i.e., the extraction of electrical power via such a method does not reduce engine efficiency. In fact, since power consuming items would no longer need to be driven by the engine or by engine-generated electricity, the effective efficiency of the engine would be increased.

The present invention uses the Seebeck generator effect of extracting heat from vehicle hot exhaust pipe gases to produce a voltage for use in the vehicle.

SUMMARY OF THE INVENTION

The present invention is comprised of a thermoelectric voltage generator cooperating with hot exhaust pipe gases from an internal combustion engine for providing electrical energy therefrom.

The generator is comprised of a plurality of thermoelectric elements of alternate N- and P-type semiconductors having an air gap therebetween in which the semiconductors are disposed in rows around a section of a vehicle exhaust pipe with an inner layer of insulation separating the semiconductors and the exhaust pipe and an outer layer of insulation between the semiconductors and a heat sink. A plurality of inner electrical contacts are positioned between the inner layer of insulation and across alternate air gaps between N- and P-type semiconductors to form a plurality of hot thermojunctions at the interface between the inner electrical contacts and the N- and P-type semiconductors. Also, a plurality of outer electrical contacts are positioned between the outer layer of insulation and across the other alternate air gaps between N- and P-type semiconductors to form a plurality of cold thermojunctions at the interface between the outer electrical contacts and the N- and P-type semiconductors.

Electrical connections are attached to opposite ends of the serially connected thermoelectric elements. After a short warm-up time for a vehicle, a high temperature gas is exhausted out the exhaust pipe and creates a differential hot to cooler temperature radially outward through the thermoelectric elements. Electrons are excited and move away from the hot thermojunctions toward the cold thermojunctions in the N-type semiconductor and holes move away from the hot thermojunction toward the cold thermojunctions in the P-type semiconductors. Each of the N- and P-type semiconductors, therefore, develop a small voltage in which all of the small voltages are serially added to develop a much larger voltage at the electrical connections at opposite ends of the serially connected thermoelectric elements.

BRIEF DESCRIPTION OF THE DRAWINGS

FIG. 1 shows a side sectional view of the present invention; and

FIG. 2 illustrates an end sectional view of the present invention.

DETAILED DESCRIPTION OF THE PREFERRED EMBODIMENT

FIGS. 1 and 2 illustrate the thermoelectric voltage generator with FIG. 1 shown as a side section of FIG. 2. Hot exhaust gases pass through the exhaust pipe 18. Heat collectors, shown as inner fins 11, may be extruded along the interior wall of 18. The inner fins 11 may also be extruded in an aluminum tube which is inserted as a section in the exhaust pipe. These inner fins 11 aid in collecting and transferring heat from the hot gases to the exhaust pipe 18 wall. Heat flows radially outward through an inner layer of electrical insulation 20 which is contiguous therewith and in intimate contact with the hot exhaust pipe 18, a plurality of inner electrical contacts 16, a plurality of alternate N- and P-type thermoelectric elements 26, a plurality of outer electrical contacts 17, an outer layer of electrical insulation 14, and into a heat sink 13 generally comprised of a composite unit of a thermal conductor 10 having cooling fins 12 cut thereon. The outward flow of heat creates a temperature gradient along the plurality of thermoelectric elements 26, or N- and P-type semiconductors, in the direction of heat flow, and therefore a voltage is developed by virtue of the Seebeck effect. Various N- and P-type semiconductors may be used. One example is the P-type semiconductor may be made of the combination of 75% of $Sb_2Te_3$, 25% of $Bi_2Te_3$, and excess Te and the N-type semiconductor may be made of the combination of 95% of $Bi_2Te_3$, 5% of $Bi_2Se_3$, and excess $SbI_3$. The inner and outer electrical contacts 16 and 17 are preferably made of copper.

By alternating N-type semiconductors and P-type semiconductors of 26 and electrically connecting them in series by alternately connecting both the inner and outer electrical contacts 16 and 17 across alternate air gaps 50 between each of the plurality of thermoelectric elements 26, the voltage developed in each of the elements 26 combine additively to develop a much larger voltage. A desired amount of voltage is obtained on output electrical connections to terminals $-V_1$ and $+V_2$ by the number of elements 26 along the hot exhaust pipe. Output current may be chosen by the number of rows of elements 26 along the exhaust pipe 18, i.e., by controlling the number of "spokes" of elements 26, as can be readily seen in FIG. 2. However, the cross-sectional area (that faces the hot exhaust pipe 18) to length of element 26 ratio is a factor in current production.

A typical means of producing the thermoelectric voltage generator is as follows. An insulator film, forming inner electrical insulation 20, may be applied to the outer surface of the before mentioned aluminum tube section of the exhaust pipe. Electrical contacts 16 may be made of copper and may be formed by sputtering followed by electrodeposition. The thickness of both the insulation 20 and contacts 16 and 17 would be about 0.010 inch. The thermoelements 26 may be installed with a high temperature solder. The outer electrical contacts 17 may be extruded and cut into semi-cylinders. The inside portion may be processed as described for the inner electrical contacts 16, i.e., formed by sputtering followed by electrodeposition. The contacts 17 may be pretinned with a relatively low temperature solder. Each half of the semi-cylinders may be put in place and soldered to another half to form a plurality of circular electrical contacts for both 16 and 17.

The operation of the thermoelectric voltage generator is as follows. The insulation layers 20 and 14 are typically electrically insulative but are heat conductive. A typical material for 20 and 14 may be alumina. The plurality of inner electrical contacts 16, preferably circular rings, are each contiguous with the insulation layer 20 and about one half of adjacent N-type and P-type semiconductors of elements 26. The elements of 26 are separated by an insulative air gap 50. Also, the plurality of outer electrical contacts 17, preferably circular rings also, are each contiguous with the insulation layer 14 and about one half of adjacent N-type and P-type semiconductors of elements 26. Contacts 16 and 17 are connected across alternate air gaps 50 to form an electrical series connection of elements 26. Since electrons flow away from the hot temperature side of the N-type semiconductors to the cold side and holes move away from the hot temperature side of the P-type semiconductors to the cold side, the additive voltage will be produced as follows. Positive current (holes) will be driven from a hot thermojunction 16a at the interface of contacts 16 and elements 26 to a cold thermojunction 17a at the interface of contacts 17 and elements 26. Thus, a more positive potential exists at cold thermojunction 17a than at hot thermojunction 16a. Likewise, by the same process of negative current (electrons) collecting at cold thermojunction 17b after leaving hot thermojunction 16b, a more negative potential exists at 17b than at 16b. The resulting voltages $-V_1$ and $+V_2$ that are developed at opposite ends of the elements 26 may be connected to some device of the vehicle to perform work.

Obviously many modifications and variations of the present invention are possible in light of the above teachings. It is therefore to be understood, that within the scope of the appended claims, the invention may be practiced otherwise than as specifically described.

For example, all of the air gaps within the device may be filled with some thermal and electrical insulation, such as asbestos, and both ends sealed off to prevent isolated cooling.

I claim:

1. A vehicle hot exhaust thermoelectric voltage generator utilizing hot exhaust pipe gases from an internal combustion engine for providing electrical energy, said generator comprising in combination:

an exhaust pipe having a plurality of inner fin heat collectors on the interior thereof;

an inner layer of insulation around the exterior of said exhaust pipe at least surrounding said plurality of heat collectors, said inner layer of insulation being electrically insulative and heat conductive;

a plurality of inner electrical contacts contiguous with said inner layer of insualtion;

a plurality of thermoelectric elements comprised of alternate N- and P-type semiconductors having air spaces therebetween;

a plurality of outer electrical contacts;

an outer layer of insulation contiguous with and surrounding said plurality of outer electrical contacts, said outer layer of insulation being electrically insulative and heat conductive, wherein said plurality of inner electrical contacts connected across alternate air spaces to said N- and P-type semiconductors to form hot thermojunctions at the interface of said plurality of inner electrical contacts and said plurality of N- and P-type semiconductors and wherein said plurality of outer electrical contacts connected across alternate air spaces to said N- and P-type semiconductors to form cold thermojunctions at the interface of said plurality of outer electrical contacts whereby said plurality of N- and P-type semiconductors are electrically in series;

a heat sink contiguous with said outer layer of insulation; and electrical connections connected to opposite ends of the serially connected plurality of thermoelectric elements for providing an electrical energy source to an external device by the Seebeck effect across the serially connected plurality of thermoelectric elements.

2. A thermoelectric voltage generator as set forth in claim 1 wherein said plurality of inner fin heat collectors are extruded fins along the interior wall of the exhaust pipe.

3. A thermoelectric voltage generator as set forth in claim 1 wherein said plurality of inner fin heat collectors are fins extruded in an aluminum tube which is inserted as a section of said exhaust pipe.

4. A thermoelectric voltage generator as set forth in claim 3 wherein said plurality of inner electrical contacts and said plurality of outer electrical contacts are made of copper that is pretinned with a relatively low temperature solder.

5. A thermoelectric voltage generator as set forth in claim 4 wherein said inner and outer layers of insulation and said plurality of inner and outer electrical contacts are about 0.01 inch thick.

6. A thermoelectric voltage generator as set forth in claim 5 wherein said N-type semiconductor is made of a combination of 95% $Bi_2Te_3$ and 5% $Bi_2Se_3$ and excess of $SbI_3$ and wherein said P-type semiconductor is made of a combination of 75% $Sb_2Te_3$ and 25% $Bi_2Te_3$ and excess Te.

7. A thermoelectric voltage generator as set forth in claim 6 wherein said heat sink is comprised of a composite unit thermal conductor having cooling fins cut thereon.

* * * * *